May 8, 1962 J. J. MATYSEK 3,034,071
EXPONENTIAL BACKWARD SWEEP WAVE VOLTAGE GENERATOR
WHICH CAN BE ARRESTED AT ANY LEVEL
Filed Nov. 25, 1959 2 Sheets-Sheet 1

INVENTOR.
JOHN J. MATYSEK
BY
Wade Koontz
S. A. Stricklett
ATTORNEYS

INVENTOR.
JOHN J. MATYSEK
BY Wade Koontz
S. A. Strickler
ATTORNEYS

United States Patent Office 3,034,071
Patented May 8, 1962

3,034,071

EXPONENTIAL BACKWARD SWEEP WAVE VOLTAGE GENERATOR WHICH CAN BE ARRESTED AT ANY LEVEL

John J. Matysek, Fern Park, Fla., assignor to the United States of America as represented by the Secretary of the Air Force Filed Nov. 25, 1959, Ser. No. 855,480
4 Claims. (Cl. 331—74)

This invention relates to a sweep voltage wave generator, and particularly to an electronic device for producing a controllable sweep voltage wave.

The recent development of the voltage tuned backward wave oscillator has created a need for a simple electronic generator for producing a variable voltage to be applied to the voltage sensitive element of the backward wave oscillator.

The control voltage for a backward wave oscillator should be varied or swept through the entire range of voltage required to change the frequency of the backward wave oscillator from a desired minimum to a desired maximum frequency. This control voltage should be capable of being stopped instantaneously without hunting, held at any value within the desired range for any desired period and caused to resume sweeping whenever desired.

Heretofore, such variable wave generators have been either mechanical, such as motor driven devices, or electromechanical, such as magnetic controlled devices. The present invention consists of three electronic stages each consisting of an electron tube and associated tuning circuits. It has been found possible with this electronic generator to sweep a steady regulated 1500 volts through the rang of 1100 volts to 290 volts at a current of 0.001 amp., which is capable of varying the output frequency of a Huggins HO-3 backward wave oscillator through a range of 5600 to 3600 megacycles. With a change in tuning, i.e. with a few changes in power dissipation and resistance values of the resistors involved, the same unit has been used to sweep the same steady regulated 1500 volts through the range of 750 to 100 volts at a current of 0.040 amp., which is sufficient to vary the output frequency of a Raytheon Carcinotron backward wave oscillator through the 5600 to 3600 megacycle range.

A construction according to the invention consists of a three stage electronic voltage wave generator having a first or driver stage, a shaper stage and an output stage. The driver stage produces a substantially linear sweep voltage wave which is applied as a control voltage to the shaper stage to generate an exponential control voltage wave for controlling the output stage which converts a substantially steady regulated potential to an exponential sweep voltage wave. In a particular application to a backward wave oscillator a steady potential of 1500 volts was converted to an exponential wave varying from 1100 to 290 volts.

The period of the driver is controlled by varying the charging rate of a grid control capacitor and the wave may be stopped at any desired level by applying a negative bias to control the charge on the control capacitor and the sweep will be resumed upon removal of the bias voltage.

It is accordingly an object of the inevntion to provide a simple electronic variable voltage wave generator.

It is a further object of the invention to provide a variable wave generator in which the wave period may be readily regulated.

It is another object of the invention to provide a sweep wave voltage generator in which the output potential may be arrested and held at any desired level for any desired period.

Other objects and advantages of the invention will be apparent from the following detailed description taken in conjunction with the accompanying drawings in which.

Figure 1:
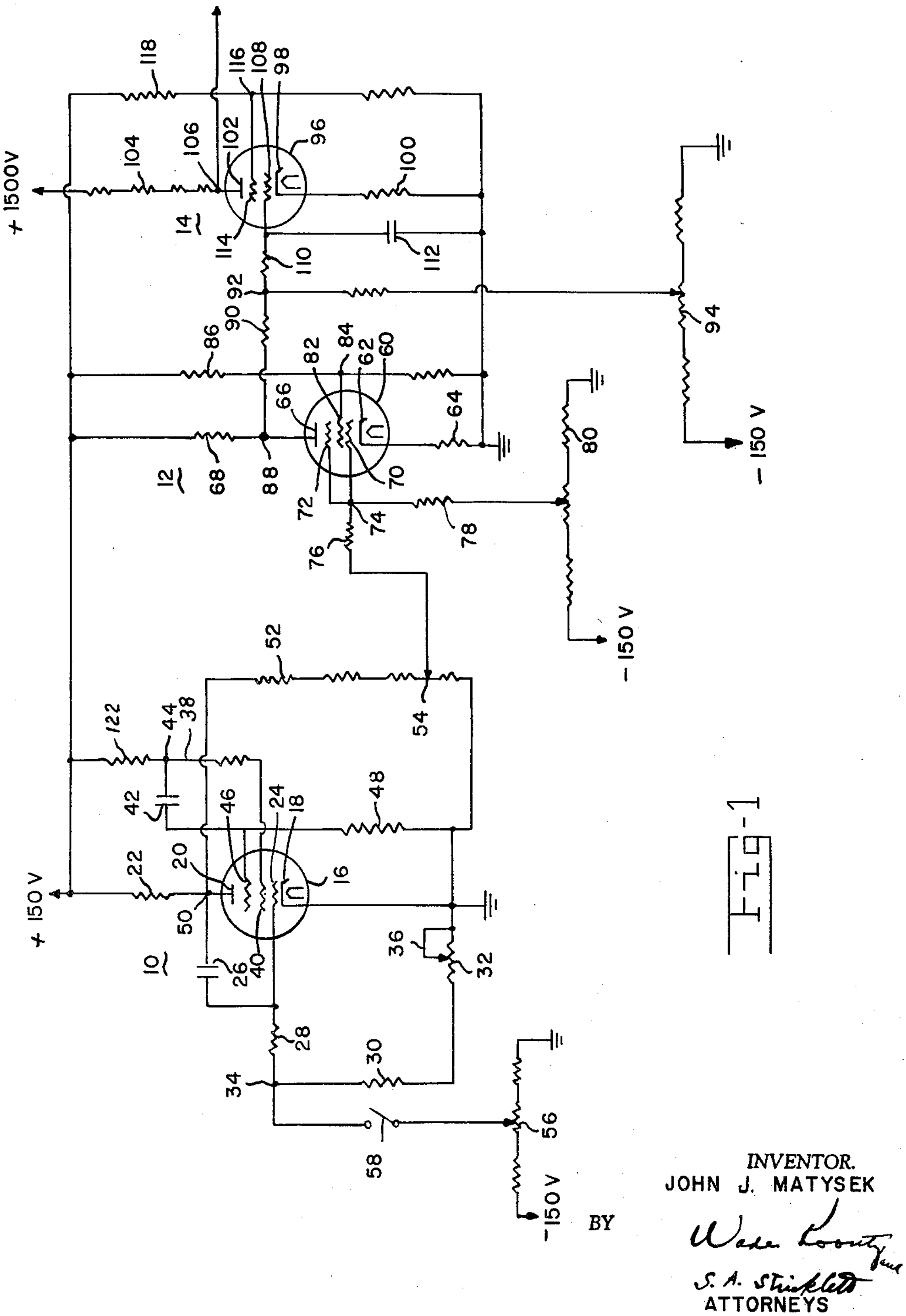
FIG. 1 is a schematic wiring diagram of the variable wave generator.

In an exemplary embodiment according to the invention a first or driver stage 10 delivers a substantially linear sweep wave voltage to a shaper stage 12, which is responsive to the application of the linear sweep voltage wave to produce a substantially exponential output sweep voltage 200, which exponential wave 200 is applied to the output stage 14 to control current flow through the output stage 14 to convert a substantially constant high potential to an exponential output potential 202.

Driver stage 10 is constructed around a multi-electrode electron tube 16, such as a 5784WA. The cathode 18 of the tube 16 is directly connected to ground, while the anode 20 is connected to a supply source, "not shown," of substantially constant potential through a load impedance 22. The control grid 24 is connected to the anode 20 through a capacitor 26. Grid 24 is connected to ground through a grid resistor comprising a first portion 28, second portion 30 and a variable portion 32. Obviously the portions 28, 30 and 32 may be a continuous resistor with a tap 34 intermediate the ends thereof and a variable connection 36 for varying the total resistance. A resistor 38 is connected from the supply source to a screen grid 50 and a capacitor 42 is connected from an intermediate tap 44 of the resistor and to the suppressor grid 46 of the tube 16. The stabilizer resistor 48 is connected from the suppressor grid 46 to ground. An output terminal 50 for anode 20 is connected to ground over a voltage divider 52 having intermediate tap 54. A source of variable biasing potential 56 is connected to the mid tap 34 of the grid resistor and is controlled by a switch 58, which may be manually or relay controlled or the bias supply voltage may be varied at 56 by a discriminator or a sensing device.

The shaper stage also includes a multi-electrode electron tube 60, such as a type 5784WA, having a cathode 62 connected to ground through a voltage limiting resistor 64. The anode 66 is connected to the supply source over a load impedance 68. A control grid 70 and suppressor grid 72 are connected together, which develops the desired exponential output, and connected to a mid tap 74 of a voltage divider consisting of a first portion 76 and second portion 78, connected between the tap 54 of voltage divider 52 and a source 80 of variable negative bias potential. A screen grid 82 is connected to an intermediate tap 84 of a voltage divider 86 connected between the supply voltage source and ground. The output terminal 88 is connected over a voltage divider 90 having an intermediate tap 92 to a source 94 of variable negative bias potential.

The output stage 14 is based on a multi-electrode electron tube 96, such as a type 6098/6AR6W, having a cathode 98 connected to ground over voltage limiting resistor 100. The anode 102 is connected to a substantially constant regulated source of high potential such as 1500 volts by means of voltage regulating impedance 104. Output terminal 106 is connected to the anode 102. The control grid 108 is connected to intermediate tap 92 of voltage divider 90 by means of resistor 110. The grid 108 is further connected to ground by a capacitor 112. A screen grid 114 is connected to an intermediate tap 116 of a voltage divider 118 connected between the supply voltage source and ground.

In the operation of the construction, according to the invention, the supply potential is applied to anode 20 of driver tube 16 and the potential of the anode 20 is connected over the capacitor 26 to a control grid 24 and the grid resistor 28, 30 and 32 cooperates with capacitor 26 to control the voltage on grid 24 and consequently a current through tube 16 and the resulting voltage at output point 50. The output voltage is further modified by capacitor 42, charged over a portion 122 of voltage divider 38 and resistor 48. The output voltage wave from output point 50 is applied over the voltage divider 52 and a suitable potential is tapped off at an intermediate point, such as tap 54. The potential of the tap 54 is applied to the control electrodes 70 and 72 of tube 60 to cause an exponential type current to flow through the tube 60 to provide an exponential voltage wave at output point 88 with the lower potential being determined by the voltage limiting impedance 68. The voltage output at point 88 is connected to a variable negative bias 94 so that control grid 108 of the output stage 96 has applied thereto the exponential output of the shaper tube 60 so that the current flowing in tube 96 is substantially exponential to produce an exponential potential at the output terminal 106.

Figures 2, 3, 4, 5, 6, 7:
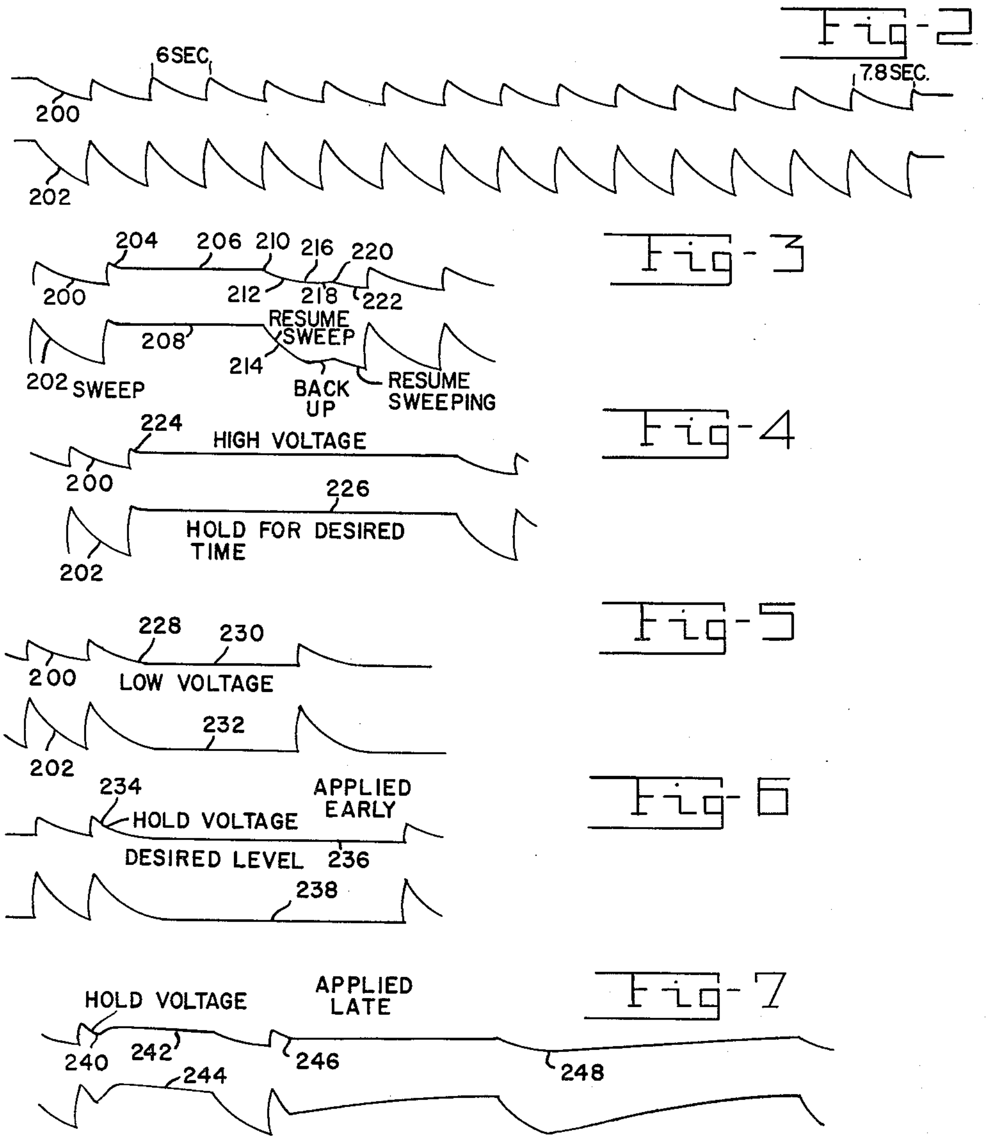
FIG. 2 is a reproduction of a recording of the output wave forms of the control stage and the output stage.
FIG. 3 is a similar view of the output wave potential showing the ability to sweep, hold at a high level, resume the sweep, back up and again resume the sweep.
FIG. 4 is a similar view of the output voltage showing the ability to hold a high potential for a desired time.
FIG. 5 is a similar view showing the holding of a low potential.
FIG. 6 is a similar view showing the premature application of the hold voltage to establish a desired level; and, FIG. 7 is a similar view showing the delayed application of a hold voltage with a return of the held voltage to desired level.

In order to control the period of the output wave 202 the adjusting device 36 is operable to vary the impedance of the grid resistor to change the charging time of the capacitor 26 so that the output exponential wave will be varied as shown in FIG. 2 from a minimum period of substantially 6 seconds to a maximum of substantially 7.8 seconds. This adjustment can also be made by changing the values of the resistors.

In order to arrest the voltage 202 at any desired level a negative potential from source 56 is applied to tap 34 of the grid resistor of grid 24. The value of the bias potential may be adjusted to hold the output at any desired level from minimum to maximum.

As shown in FIG. 3 if sufficient negative potential is applied at the peak 204 of wave 200, the wave 200 will be held constant at 206 and the output wave 202 will be held constant as at 208. If the negative hold potential is released at 210 the waves 200 and 202 will resume sweeping as at 212 and 214, then if the held bias is restored at point 216, the wave will start back up to the high level at 218, but if again released at 220, the wave will start sweeping 222 from the point 220 of release.

In FIG. 4, if the high hold bias is applied at the high point 224 of wave 200, the output wave 202 may be held at the high level 226 for any desired time. Also, as shown in FIG. 5, when the proper bias is applied at the low point the control voltage is held low at 230 and the output follows at 232.

If the proper bias for a low hold voltage is applied prematurely as at 234, the sweep 200 will be interrupted and the wave will seek the level 236 determined by the bias and the output will follow at 238. On the other hand, if the bias is applied as at 240 after the wave 200 has dropped below the level determined by the bias, the sweep will be interrupted and the wave will raise to the selected level 242 and the output 202 will follow at 244. This is further illustrated at 246 lower on the sweep and at 248 substantially at the bottom of the sweep. In all cases the output voltage rises to the voltage corresponding to the bias.

For purpose of exemplification a particular embodiment has been shown and described according to the best present understanding thereof. However, it will be apparent to those skilled in the art that various changes and modifications in the construction and arrangement of the parts thereof may be resorted to without departing from the true spirit and scope of the invention.

I claim:

1. A sweep wave generator comprising a first driver stage providing a substantially linear sweep voltage, a second shaper stage converting the output of the driver stage to an exponential sweep voltage and an output stage controlled by the output of said shaper stage to convert a substantially constant supply potential to an exponential varying potential, said driver stage including a first electron tube having a cathode connected to ground, an anode, a voltage divider connected between said anode and ground, said second shaper stage including a second electron tube having a cathode, a control electrode, a screen electrode, a suppressor electrode and an anode, a resistor connecting the cathode of said shaper stage to ground, said control electrode and said suppressor electrode being connected together, a source of variable biasing potential, a control voltage divider connected between an intermediate tap on said first voltage divider and said source of variable biasing potential, a connection from an intermediate point of said control voltage divider and said control and suppressor electrodes, a second source of variable biasing potential, a shaper output voltage divider connected between the shaper stage anode and said second source of variable biasing potential, said output stage including an electron tube having a cathode, a control grid, a screen grid and an anode, an output voltage limiting resistor connected between said output stage cathode and ground, an output voltage control resistor connected between said output stage anode and an independent source of potential, an output voltage connection to said output stage anode, a resistor connected between said output stage control grid and an intermediate tap in said shaped voltage output voltage divider, and a capacitor connected between said output stage control grid and ground.

2. A sweep wave generator comprising a first driver stage providing a substantially linear sweep voltage, a second shaper stage converting the output of the driver stage to an exponential sweep voltage and an output stage controlled by the output of said shaper stage to convert a substantially constant supply potential to an exponential varying potential, said driver stage including a first electron tube having a cathode connected to ground, an anode, an impedance connecting said anode to a substantially constant potential, a control grid, a capacitor connecting said anode to said control grid, a grid resistor connecting said control grid to ground, means for varying the value of said grid resistor for varying the ouput wave length, a screen grid, a voltage divider connected between said anode and ground, said second shaper stage including a second electron tube having a cathode, a control electrode, a screen electrode, a suppressor electrode and an anode, a resistor connecting the cathode of said shaper stage to ground, said control electrode and said suppressor electrode being connected together, a source of variable biasing potential, a control voltage divider connected between an intermediate tap on said first voltage divider and said source of variable biasing potential, a connection from an intermediate point of said control voltage divider and said control and suppressor electrodes, a second source of variable biasing potential, a shaper output voltage divider connected between the shaper stage anode and said second source of variable biasing potential, said output stage including an electron tube having a cathode, a control grid, a screen grid and an anode, an output voltage limiting resistor connected between said output stage cathode and ground, an output voltage control resistor connected between said output stage anode and an independent source of potential, an output voltage connection to said output stage anode, a second voltage divider connected between said supply potential and ground, a connection from an intermediate tap on said second voltage divider and said screen grid, a resistor connected between said output stage control grid and an intermediate tap in said shaped voltage output voltage divider, and a capacitor connected between said output stage control grid and ground.

3. A sweep wave generator comprising a first driver stage providing a substantially linear sweep voltage, a second shaper stage converting the output of the driver stage to an exponential sweep voltage and an output stage controlled by the output of said shaper stage to convert a substantially constant supply potential to an exponential varying potential, said driver stage including a first electron tube having a cathode connected to ground, an anode, an impedance connecting said anode to a substantially constant potential, a control grid, a capacitor connecting said anode to said control grid, a grid resistor connecting said control grid to ground, an auxiliary source of negative biasing potential, connections for applying said negative biasing potential at an intermediate point on said grid resistor to stop the sweep action, a voltage divider connected between said anode and ground, said second shaper stage including a second electron tube having a cathode, a control electrode, a screen electrode, a suppressor electrode and an anode, a resistor connecting the cathode of said shaper stage to ground, a resistor connecting the anode of said shaper stage to said source of supply potential, said control electrode and said suppressor electrode being connected together, a source of variable biasing potential, a control voltage divider connected between an intermediate tap on said first voltage divider and said source of variable biasing potential, a connection from an intermediate point of said control voltage divider and said control and suppressor electrodes, a second source of variable biasing potential, a shaper output voltage divider connected between the shaper stage anode and said second source of variable biasing potential, said output stage including an electron tube having a cathode, a control grid, a screen grid and an anode, an output voltage limiting resistor connected between said output stage cathode and ground, an output voltage control resistor connected between said output stage anode and an independent source of potential, an output voltage connection to said output stage anode, a resistor connected between said output stage control grid and an intermediate tape in said shaped voltage output voltage divider, and a capacitor connected between said output stage control grid and ground.

4. A sweep wave generator comprising a first electron tube having a cathode connected to ground, an anode, an impedance connecting said anode to a substantially constant potential, a control grid, a capacitor connecting said anode to said control grid, a grid resistor connecting said control grid to ground, a substantially linear sweep wave output circuit including a voltage divider connected between said anode and ground, a shaper circuit controlled by said linear sweep voltage wave for providing an exponential sweep voltage wave, said shaper circuit including an output sweep wave voltage divider, a source of variable biasing potential, said shaper output voltage divider connected to said source of variable biasing potential, an output electron tube having a cathode, a control grid, a screen grid and an anode, an output voltage limiting resistor connected between said output stage cathode and ground, an output voltage control resistor connected between said output stage anode and an independent source of substantially constant supply potential, an output voltage connection to said output stage anode, a voltage divider connected between said supply potential and ground, a connection from an intermediate tap on said second voltage divider and said screen grid, a resistor connected between said output stage control grid and an intermediate tap in said shaped voltage output voltage divider, and a capacitor connected between said output stage control grid and ground.

References Cited in the file of this patent

UNITED STATES PATENTS

| | | |
|---|---|---|
| 2,094,677 | Schlesinger | Oct. 5, 1937 |
| 2,905,817 | Smith | Sept. 22, 1959 |
| 2,924,787 | Diem | Feb. 9, 1960 |

OTHER REFERENCES

Pub. I MIT Radiation Laboratory Series, vol. 19, pp. 160–161 and page 649.